US012610538B2

(12) United States Patent
Liu et al.

(10) Patent No.: US 12,610,538 B2
(45) Date of Patent: Apr. 21, 2026

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei City (CN)

(72) Inventors: Youming Liu, Hefei City (CN); Deyuan Xiao, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 574 days.

(21) Appl. No.: 18/167,828

(22) Filed: Feb. 10, 2023

(65) Prior Publication Data

US 2023/0345711 A1      Oct. 26, 2023

Related U.S. Application Data

(63) Continuation of application No. PCT/CN2022/107928, filed on Jul. 26, 2022.

(30) Foreign Application Priority Data

Apr. 24, 2022      (CN) .......................... 202210434127.9

(51) Int. Cl.
*H10B 12/00*          (2023.01)
(52) U.S. Cl.
CPC ........... *H10B 12/488* (2023.02); *H10B 12/02* (2023.02); *H10B 12/482* (2023.02)

(58) Field of Classification Search
CPC .... H10B 12/488; H10B 12/02; H10B 12/482; H10B 12/05
See application file for complete search history.

(56) References Cited

U.S. PATENT DOCUMENTS

| | | | |
|---|---|---|---|
| 6,570,781 | B1 | 5/2003 | Lee |
| 6,680,859 | B1 | 1/2004 | Lee |
| 6,947,324 | B1 | 9/2005 | Lee |
| 7,184,290 | B1 | 2/2007 | Lee |
| 7,596,011 | B1 | 9/2009 | Lee |
| 7,609,538 | B1 | 10/2009 | Lee |

(Continued)

FOREIGN PATENT DOCUMENTS

| | | |
|---|---|---|
| CN | 111279465 A | 6/2020 |
| CN | 113451269 A | 9/2021 |

(Continued)

OTHER PUBLICATIONS

CN first office action in application No. 202210434127.9, mailed on Jan. 24, 2025.

*Primary Examiner* — Mohammed R Alam
(74) *Attorney, Agent, or Firm* — SYNCODA LLC; Feng Ma

(57)                    ABSTRACT
A semiconductor structure includes a substrate and multiple word lines located on a top surface of the substrate. Each of the word lines extends in a direction parallel to the top surface of the substrate. The multiple word lines are arranged at intervals in a direction perpendicular to the top surface of the substrate. Any two adjacent word lines are at least partially staggered with respect to one another in the direction perpendicular to the top surface of the substrate.

14 Claims, 5 Drawing Sheets

(56)     References Cited

U.S. PATENT DOCUMENTS

|  |  |  |  |
|---|---|---|---|
| 7,683,490 B2 | 3/2010 | Sekine | |
| 10,170,570 B1 * | 1/2019 | Sonehara | H10B 43/35 |
| 10,861,854 B2 | 12/2020 | Kim | |
| 2007/0138645 A1 | 6/2007 | Sekine | |
| 2009/0166872 A1 | 7/2009 | Chung et al. | |
| 2021/0225872 A1 | 7/2021 | Sun et al. | |
| 2021/0358916 A1 | 11/2021 | Liu | |
| 2022/0013524 A1 | 1/2022 | Ryu et al. | |
| 2022/0077151 A1 | 3/2022 | Lee | |

FOREIGN PATENT DOCUMENTS

|  |  |  |  |
|---|---|---|---|
| CN | 113903741 A | 1/2022 | |
| CN | 114141864 A | 3/2022 | |
| JP | H1168066 A | 3/1999 | |

* cited by examiner

SEMICONDUCTOR STRUCTURE AND METHOD FOR FORMING SEMICONDUCTOR STRUCTURE

CROSS-REFERENCE TO RELATED APPLICATIONS

This is a continuation of International Patent Application No. PCT/CN2022/107928 filed on Jul. 26, 2022, which claims priority to Chinese Patent Application No. 202210434127.9 filed on Apr. 24, 2022. The disclosures of the above-referenced applications are hereby incorporated by reference in their entirety.

BACKGROUND

A Dynamic Random Access Memory (DRAM) is a semiconductor device commonly used in electronic devices such as computers, and is composed of multiple storage units. Each storage unit typically includes a transistor and a capacitor. A gate of the transistor is electrically connected to a word line, a source is electrically connected to a bit line, and a drain is electrically connected to the capacitor. A word line voltage on the word line can control the turn-on and turn-off of the transistor, so that data information stored in the capacitor can be read from or written into the capacitor through the bit line.

In a semiconductor structure such as the DRAM, multiple word lines are located at the same level, which results in that a capacitive coupling effect between adjacent word lines is strong, thereby affecting the electrical performance of the semiconductor structure.

Therefore, how to reduce the capacitive coupling effect between adjacent word lines so as to improve the performance of the semiconductor structure is currently an urgent technical problem to be solved.

SUMMARY

The disclosure relates to the technical field of semiconductor manufacturing, and more particularly, to a semiconductor structure and a method for forming the semiconductor structure.

According to some embodiments, the disclosure provides a semiconductor structure, including: a substrate and multiple word lines.

The multiple word lines are located on a top surface of the substrate. Each of the word lines extends in a direction parallel to the top surface of the substrate. The multiple word lines are arranged at intervals in a direction perpendicular to the top surface of the substrate. Any two adjacent word lines are at least partially staggered with respect to one another in the direction perpendicular to the top surface of the substrate.

According to other embodiments, the disclosure also provides a method for forming the semiconductor structure as described in any of the above, including the following operation of:

providing a substrate; and forming multiple word lines on a top surface of the substrate, with each of the word lines extending in a direction parallel to the top surface of the substrate, the multiple word lines being arranged at intervals in a direction perpendicular to the top surface of the substrate, and any two adjacent word lines being at least partially staggered with respect to one another in the direction perpendicular to the top surface of the substrate.

DETAILED DESCRIPTION

The specific embodiments of a semiconductor structure and a method for forming a semiconductor structure provided in the disclosure will be described in detail below with reference to the drawings.

Figure 1:
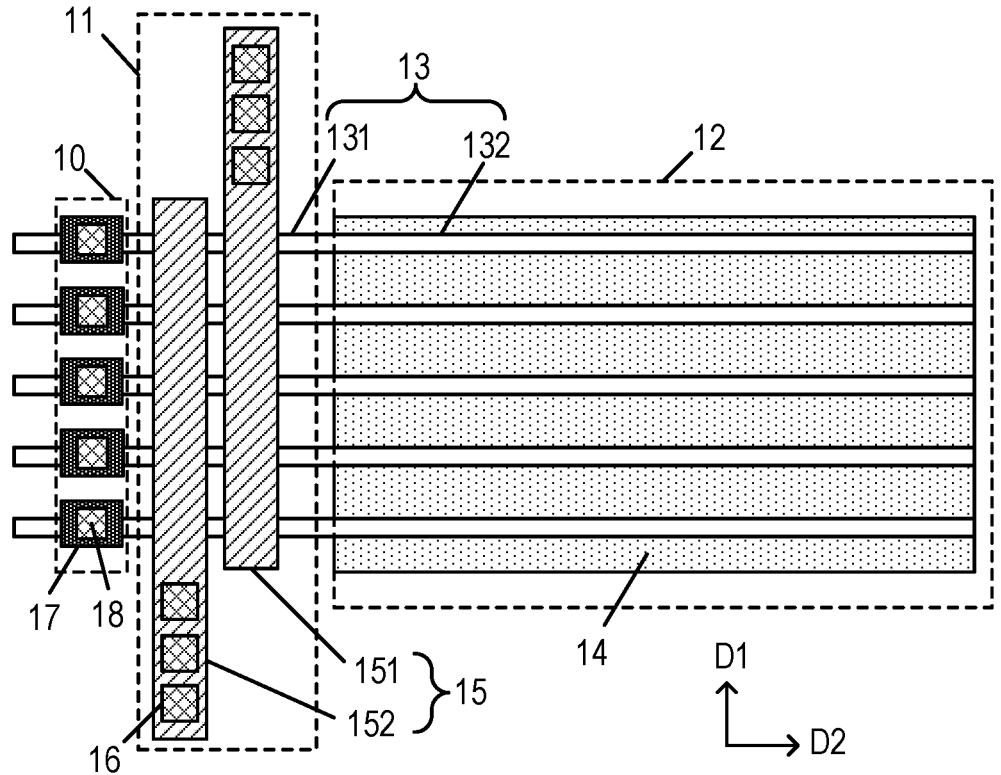
FIG. 1 is a first schematic top view of a semiconductor structure of the disclosure.
Figure 2:
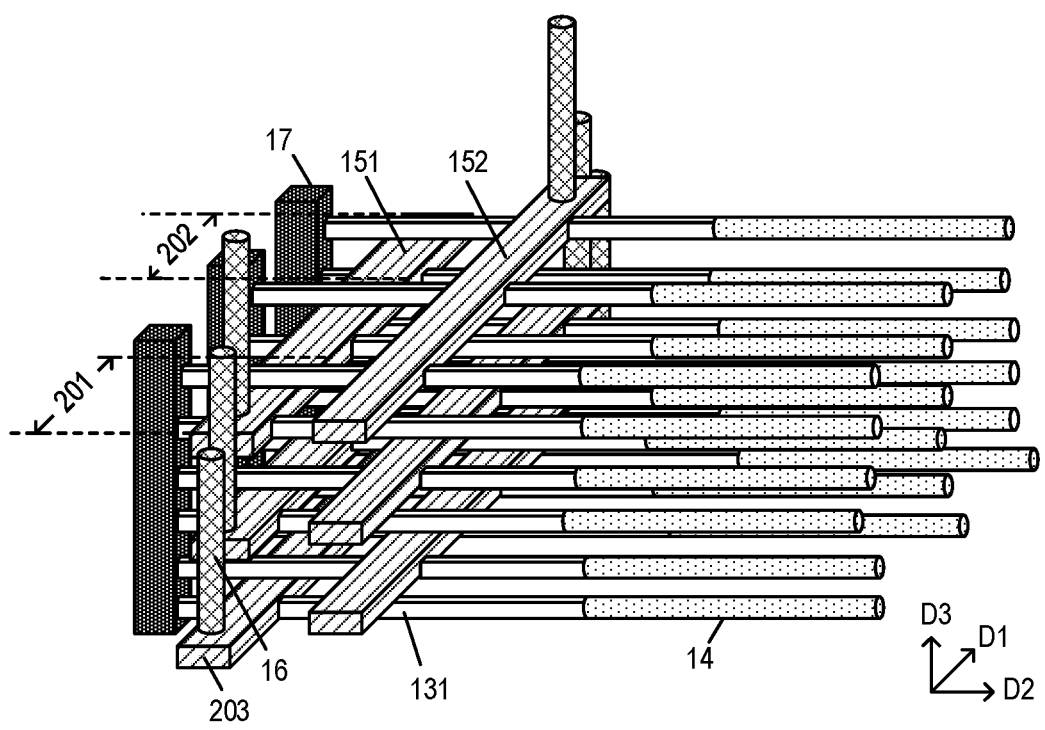
FIG. 2 is a first schematic perspective view of a semiconductor structure of the disclosure.

This specific embodiment provides a semiconductor structure. FIG. 1 is a first schematic top view of a semiconductor structure in a specific embodiment of the disclosure. FIG. 2 is a first schematic perspective view of a semiconductor structure in a specific embodiment of the disclosure. The semiconductor structure in this specific embodiment may be, but is not limited to, a DRAM. As shown in FIGS. 1 and 2, the semiconductor structure includes: a substrate and multiple word lines.

The multiple word lines 15 are located on a top surface of the substrate. Each of the word lines 15 extends along a direction parallel to the top surface of the substrate. The multiple word lines 15 are arranged at intervals, along a direction D3 perpendicular to the top surface of the substrate. Any two adjacent word lines 15 are at least partially staggered with respect to one another in the direction D3 perpendicular to the top surface of the substrate.

Specifically, the substrate may be, but is not limited to, a silicon substrate. This specific embodiment will be described with reference to the silicon substrate. In other embodiments, the substrate may also be the other semiconductor substrate such as gallium nitride, gallium arsenide, gallium carbide, silicon carbide, or SOI. The substrate is configured to support a device structure thereon. The word line 15 may be made of a conductive material such as tungsten metal or TiN.

Specifically, as shown in FIGS. 1 and 2, each of the word lines 15 extends along a first direction D1 parallel to the top surface of the substrate, and the multiple word lines 15 are arranged at intervals, along the direction D3 perpendicular to the top surface of the substrate, thereby forming a horizontal word line structure. The horizontal word line structure provided by this embodiment contributes to increasing the storage density of the semiconductor structure compared with a vertical word line structure. The arrangement "any two adjacent word lines are at least partially staggered with respect to one another in the direction D3 perpendicular to the top surface of the substrate", means that, for two word lines 15 adjacent in the direction perpendicular to the top surface of the substrate, a projection of one word line 15 of the two word lines 15 on the top surface of the substrate is at least partially staggered with respect to a projection of the other word line 15 on the top surface of the substrate. Taking a first word line 151 and a second word line 152 adjacent in the direction D3 perpendicular to the top surface of the substrate as an example, a projection of the first word line 151 on a plane formed by the first direction D1 and the second direction D2 is at least partially staggered with respect to a projection of the second word line 152 on a plane formed by the first direction D1 and the second direction D2. The second direction D2 is a direction parallel to the top surface of the substrate, and the first direction D1 intersects the second direction D2. Both the first direction D1 and the second direction D2 are perpendicular to the direction D3 which is perpendicular to the top surface of the substrate. The intersection in this specific embodiment may be a vertical intersection or an inclined intersection.

In this specific embodiment, any two adjacent word lines 15 are at least partially staggered with respect to one another in the direction D3 perpendicular to the top surface of the substrate, and thus the facing area between the two adjacent word lines 15 is reduced, so as to reduce the effect of capacitive coupling between the two adjacent word lines 15. Moreover, in the present disclosure, the effect of capacitive coupling between two adjacent word lines 15 is reduced without increasing the spacing between the two adjacent word lines 15 in the direction D3 perpendicular to the top surface of the substrate, and thus does not need to increase the size of the semiconductor structure, thereby contributing to further improving the degree of integration of the semiconductor structure.

In some embodiments, any two adjacent word lines 15 are completely staggered with respect to one another in the direction perpendicular to the top surface of the substrate. Specifically, the arrangement "the multiple word lines 15 are arranged at intervals along the direction D3 perpendicular to the top surface of the substrate and any two adjacent word lines 15 are completely staggered with respect to one another" means that, in the direction D3 perpendicular to the top surface of the substrate, projections of any two adjacent word lines 15 (for example, the first word line 151 and second word line 152) on the top surface of the substrate are separated from each other (i.e. do not overlap each other). By making the two adjacent word lines 15 to be completely staggered with respect to one another, the effect of capacitive coupling between the two adjacent word lines 15 is eliminated, thereby better improving the performance of the semiconductor structure.

In some embodiments, each of the word lines 15 extends along a first direction D1. Projections of any two adjacent word lines 15 in a plane formed by the first direction D1 and the direction D3 perpendicular to the top surface of the substrate partially overlap one another.

For example, for the first word line 151 and the second word line 152 adjacent in the direction perpendicular to the top surface of the substrate, the projection of the first word line 151 in the plane formed by the first direction D1 and the direction D3 perpendicular to the top surface of the substrate partially overlaps the projection of the second word line 152 in the plane formed by the first direction D1 and the direction D3 perpendicular to the top surface of the substrate, thereby contributing to reducing the spacing between the first word line 151 and the second word line 152 in the direction D3 perpendicular to the top surface of the substrate, so as to further increase the storage density of the semiconductor structure.

In some embodiments, the multiple word lines 15 are sequentially sorted in the direction perpendicular to the top surface of the substrate. Projections of any two adjacent odd-numbered word lines 15 on the top surface of the substrate are coincident with one another (i.e. complete overlap). Projections of any two adjacent even-numbered word lines 15 on the top surface of the substrate are coincident with one another (i.e. complete overlap).

Specifically, as shown in FIGS. 1 and 2, the multiple word lines 15 are sequentially sorted in the direction D3 perpendicular to the top surface of the substrate. That is, the odd-numbered word lines 15 (e.g. the first word lines 151) and the even-numbered word lines 15 (e.g. the second word lines 152) are alternately arranged in the direction D3 perpendicular to the top surface of the substrate, and any odd-numbered word line 15 and even-numbered word line 15 which are adjacent are at least partially staggered with respect to one another in the direction D3 perpendicular to the top surface of the substrate. In some embodiments, the arrangement "projections of any two adjacent odd-numbered word lines 15 on the top surface of the substrate are coincident with one another" means that any two adjacent odd-numbered word lines 15 are aligned in the direction D3 perpendicular to the top surface of the substrate. In some embodiments, the arrangement "projections of any two adjacent even-numbered word lines 15 on the top surface of the substrate are coincident with one another" means that any two adjacent even-numbered word lines 15 are aligned in the direction D3 perpendicular to the top surface of the substrate. By the arrangement where the projections of any two adjacent odd-numbered word lines 15 on the top surface of the substrate are coincident with one another and projections of any two adjacent even-numbered word lines 15 on the top surface of the substrate are coincident with one another, the number of masks can be reduced, thereby simplifying the manufacturing process of the semiconductor structure and reducing the manufacturing cost of the semiconductor structure.

In some embodiments, each of the word lines 15 extends along a first direction D1, and each of the word lines 15 includes a first end portion 201 and a second end portion 202 opposite to the first end portion 201 in the first direction D1. The first direction D1 is a direction parallel to the top surface of the substrate. The semiconductor structure further includes multiple word line leads 16.

The multiple word line leads 16 are located on the top surface of the substrate. Each of the word line leads 16 extends along the direction D3 perpendicular to the top surface of the substrate. The word line leads 16 electrically connected to the odd-numbered word lines 15 are located at the first end portions 201 of the respective odd-numbered word lines. The word line leads 16 electrically connected to the even-numbered word lines 15 are located at the second end portions 202 of the respective even-numbered word lines 15.

Specifically, the multiple word lines 15 are sequentially sorted along the direction D3 perpendicular to the top surface of the substrate, the word line leads 16 connected to the odd-numbered word lines 15 are located at the first end portions 201 of the respective word lines 15, and the word line leads 16 connected to the even-numbered word lines 15 are located at the second end portions 202 of the respective word lines 15. That is, two of the word line leads 16, connected to any two adjacent word lines 15 are distributed on two sides of a transistor area 11 opposite to one another in the first direction D1. Thus, the distance between two adjacent word line leads 16 is increased, and the effect of capacitive coupling between the adjacent word line leads 16 is reduced, thereby further improving the electrical performance of the semiconductor structure, increasing a process window in forming the word line leads 16, and reducing the manufacturing difficulty of the semiconductor structure.

In some embodiments, each of the word lines 15 includes a first end surface 203 and a second end surface opposite to the first end surface 203 in the first direction D1.

The first end surfaces 203 of all the odd-numbered word lines 15 are flush with each other, and the second end surfaces of all the odd-numbered word lines 15 are flush with each other.

The first end surfaces of all the even-numbered word lines 15 are flush with each other, and the second end surfaces of all the even-numbered word lines 15 are flush with each other.

Specifically, the arrangement "the first end surfaces 203 of all the odd-numbered word lines 15 are flush with each other, and the second end surfaces of all the odd-numbered word lines 15 are flush with each other" means that edges of projections of all the odd-numbered word lines 15 on the top surface of the substrate are coincident with one another. The arrangement "the first end surfaces of all the even-numbered word lines 15 are flush with each other, and the second end surfaces of all the even-numbered word lines 15 are flush with each other" means that projections of all the even-numbered word lines 15 on the top surface of the substrate are coincident with one another. Due to the fact that the first end surfaces 203 of all the odd-numbered word lines 15 are flush with each other, the second end surfaces of all the odd-numbered word lines 15 are flush with each other, the first end surfaces of all the even-numbered word lines 15 are flush with each other and the second end surfaces of all the even-numbered word lines 15 are flush with each other, the manufacturing process of the semiconductor structure is simplified without etching the multiple word lines 15 to form a stepped structure. Since the word line lead 16 electrically connected to the lower word line 15 needs to pass through the upper word line 15, a side wall of this word line lead 16 also needs to be covered with an isolation layer so as to isolate the side wall of the word line lead 16 from the upper word line 15. The material of the word line lead 16 may be a conductive material such as tungsten metal, and the material of the isolation layer may be an insulating material such as silicon dioxide.

In other embodiments, in any two odd-numbered word lines 15 adjacent in the direction D3 perpendicular to the top surface of the substrate, one word line 15 closer to the substrate has a first end portion 201 which extends beyond the first end portion 201 of the other word line 15 in the first direction D1.

In any two even-numbered word lines 15 adjacent in the direction D3 perpendicular to the top surface of the substrate, one word line 15 closer to the substrate has a second end portion 202 which extends beyond the second end portion 202 of the other word line 15 in the first direction D1.

Specifically, the first end portions 201 of the multiple odd-numbered word lines 15 together form a stepped structure, and the second end portions 202 of the multiple even-numbered word lines 15 also together form a stepped structure. Thus, the word line leads 16 connected to the lower word lines 15 do not need to pass through the upper word lines 15. On the one hand, the formation process of the word line leads 16 can be simplified; on the other hand, signal crosstalk between adjacent word lines 15 can also be effectively avoided.

Figure 3:
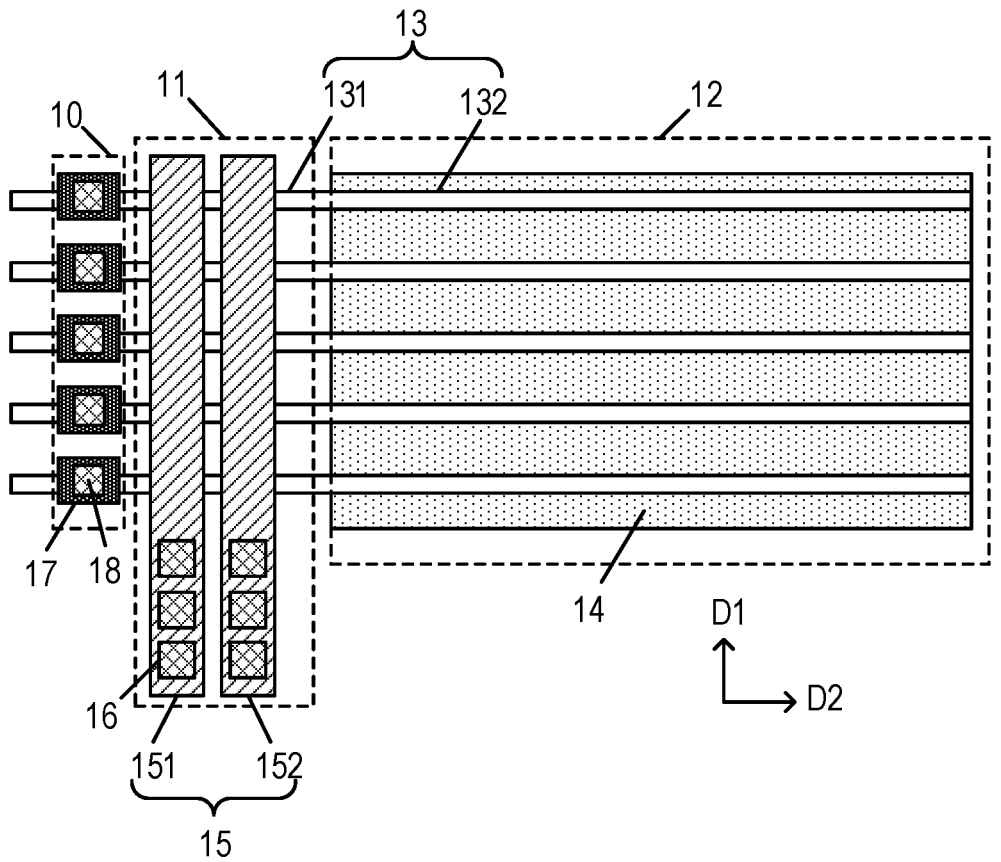
FIG. 3 is a second schematic top view of a semiconductor structure of the disclosure.
Figure 4:
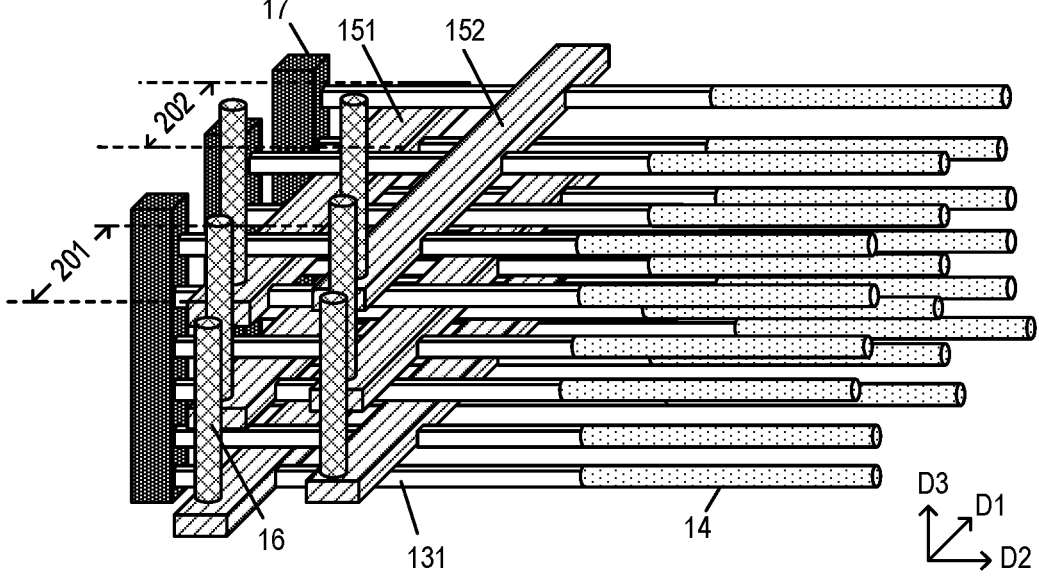
FIG. 4 is a second schematic perspective view of a semiconductor structure of the disclosure.

FIG. 3 is a second schematic top view of a semiconductor structure in a specific embodiment of the disclosure. FIG. 4 is a second schematic perspective view of a semiconductor structure in a specific embodiment of the disclosure. In the embodiments shown in FIGS. 3 and 4, each of the word lines 15 extends along a first direction D1, and each of the word lines 15 includes a first end portion 201 and a second end portion 202 opposite to the first end portion 201 in the first direction D1. The first direction D1 is a direction parallel to the top surface of the substrate. The semiconductor structure further includes multiple word line leads.

The multiple word line leads 16 are located on the top surface of the substrate. Each of the word line leads 16 extends along the direction D3 perpendicular to the top surface of the substrate. The multiple word line leads 16 are respectively electrically connected to the first end portions 201 of the multiple word lines 15.

Specifically, each of the word lines 15 includes the first end portion 201 and the second end portion 201. The multiple word line leads 16 are electrically connected to the first end portions 201 of the respective multiple word lines 15, so that signals of the multiple word lines 15 can be led out at the same side, thereby contributing to reducing the area occupied by the word line leads 16 in the semiconductor structure and improving a space utilization efficiency inside the semiconductor structure.

In some embodiments, in any two odd-numbered word lines 15 adjacent in the direction D3 perpendicular to the top surface of the substrate, one word line 15 closer to the substrate has a first end portion 201 which extends beyond the first end portion 201 of the other word line 15 in the first direction D1.

In any two even-numbered word lines 15 adjacent in the direction D3 perpendicular to the top surface of the substrate, one word line 15 closer to the substrate has a first end portion 201 which extends beyond the first end portion 201 of the other word line 15 in the first direction D1.

Specifically, the first end portions 201 of the multiple odd-numbered word lines 15 together form a stepped structure, and the first end portions 201 of the multiple even-numbered word lines 15 also together form a stepped structure. Thus, the word line leads 16 connected to the lower odd-numbered or even-numbered word lines 15 do not need to pass through the upper odd-numbered or even-numbered word lines 15. On the one hand, the formation process of the word line leads 16 can be simplified; on the other hand, signal crosstalk between adjacent word lines 15 can also be effectively avoided.

In some embodiments, in any two word lines 15 adjacent in the direction D3 perpendicular to the top surface of the substrate, one word line 15 closer to the substrate has a first end portion 201 which extends beyond the first end portion 201 of the other word line 15 in a horizontal direction.

Specifically, in any two word lines 15 adjacent in the direction D3 perpendicular to the top surface of the substrate, one word line 15 closer to the substrate has a first end portion 201 which extends beyond the first end portion 201 of the other word line 15 in a horizontal direction. Thus, the distance between the two word line leads 16 connected to the two adjacent word lines 15, respectively, can be increased, and the effect of capacitive coupling between the adjacent word line leads 16 can be reduced, thereby further improving the performance of the semiconductor structure.

In order to enhance the stability of connection between the word lines 23 and the word line leads 16, in some embodiments, a bottom surface of the word line lead 16 electrically connected to a respective one of the word lines 15 is completely located on the word line 15.

In other embodiments, a bottom surface of the word line lead 16 connected to one of the word line 15 is partially located on the word line 15.

Specifically, the bottom surface of the word line lead 16 is partially located on the word line 15. For example, in the direction D3 perpendicular to the top surface of the substrate, the overlap area between a projection of the bottom surface of the word line lead 16 and a projection of the word line 15 is greater than or equal to 60% of the total area of the projection of the bottom surface of the word line lead 16. With this structure, the process window in forming the word line lead 16 can be increased while ensuring stable electrical connection of the word line lead 16 to the word line 15, the tolerance of the manufacturing process of the semiconductor structure can be increased, and the yield of the semiconductor structure can be improved.

This specific embodiment is described by taking the word line lead 16 overlapping the surface of the word line 15 (i.e. the word line lead 16 contacting the top surface of the word line 15 away from the substrate) as an example. In other specific embodiments, the word line lead 16 may also be embedded into the word line 15, thereby increasing the contact area between the word line lead 16 and the word line 15 and reducing the contact resistance between the word line lead 16 and the word line 15.

In some embodiments, the multiple word lines 15 are sequentially sorted in the direction D3 perpendicular to the top surface of the substrate. In order to further improve the integration degree of the semiconductor structure, projections of any two adjacent $3n^{th}$ word lines 15 on the top surface of the substrate are coincident with one another, projections of any two adjacent $3n+1^{th}$ word lines 15 on the top surface of the substrate are coincident with one another, and projections of any two adjacent $3n+2^{th}$ word lines 15 on the top surface of the substrate are coincident with one another. n is an integer.

In some embodiments, the semiconductor structure further includes: multiple semiconductor layers and multiple bit lines.

The multiple semiconductor layers are located on the top surface of the substrate. Each of the semiconductor layers includes multiple active pillars 131 arranged at intervals in a first direction D1, and the multiple semiconductor layers are arranged at intervals in the direction D3 perpendicular to the top surface of the substrate. Each of the active pillars 131 includes a channel area, and a source area and a drain area arranged in a second direction D2. The source area is distributed on one side of the channel area, and the drain area is distributed on the opposite side of the channel area. Each of the word lines 15 continuously covers the multiple channel areas arranged at in intervals in the first direction D1 in one of the semiconductor layers. The first direction D1 and the second direction D2 are directions parallel to the top surface of the substrate, and the first direction D1 is orthogonal to the second direction D2.

The multiple bit lines 17 are located on the top surface of the substrate. Each of the bit lines 17 extends along the direction D3 perpendicular to the top surface of the substrate. The multiple bit lines 17 are arranged at in intervals in the first direction D1. One of the bit lines 17 is electrically connected to the multiple source areas arranged at in intervals in the direction D3 perpendicular to the top surface of the substrate.

Specifically, the material of the semiconductor layer may be, but is not limited to, silicon. As shown in FIGS. 1 and 2, the top surface of the substrate includes a transistor area 11, and a bit line area 10 and a capacitor area 12 arranged in the second direction D2. The bit line area is distributed on one side of the transistor area 11, and the capacitor area is distributed on the opposite side of the transistor area 11. The multiple semiconductor layers are arranged at intervals in the direction D3 perpendicular to the top surface of the substrate, and each of the semiconductor layers includes multiple semiconductor pillars 13 arranged at intervals in the first direction D1. The semiconductor pillars 13 include active pillars 131 located in the transistor area 11 and conductive pillars 132 located in the capacitor area 12. The active pillar 131 includes a channel area, and source and drain areas arranged in the second direction D2. The source area is distributed on one side of the channel area, and the drain area is distributed on the opposite side of the channel area. The drain area is in contact and electric connection with the conductive pillars 132, and the drain area has the same dopant ions as the conductive pillars 132 to further reduce the contact resistance between the drain area and the conductive pillars 132. The capacitive area 12 further includes multiple capacitors 14 distributed around the conductive pillars 132. The capacitor 14 includes a lower electrode layer covering a surface of the conductive pillar 132, a dielectric layer covering a surface of the lower electrode layer, and an upper electrode layer covering a surface of the dielectric layer. The multiple bit lines 17 are all located in the bit line area. Each of the bit lines 17 extends along the direction D3 perpendicular to the top surface of the substrate. The multiple bit lines 17 are arranged at intervals in the first direction D1, and one of the bit lines 17 is electrically connected to the multiple source areas which are arranged at intervals in the direction D3 perpendicular to the top surface of the substrate. Multiple bit line leads 18 are electrically connected to the respective bit lines 17, for leading out signals of the bit lines 17.

Figure 5:
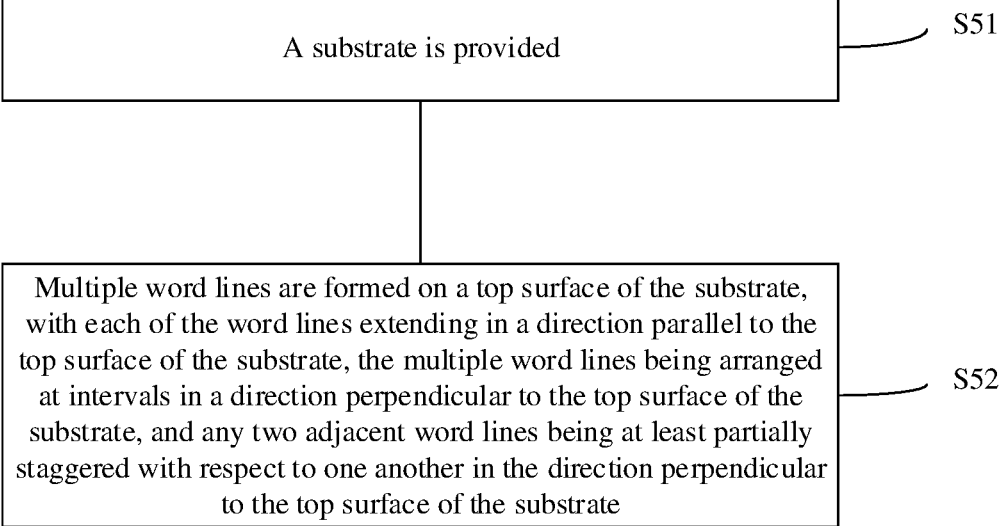
FIG. 5 is a flowchart of a method for forming a semiconductor structure of the disclosure.

This specific embodiment also provides a method for forming the semiconductor structure as described above. FIG. 5 is a flowchart of a method for forming a semiconductor structure in a specific embodiment of the disclosure. A schematic diagram of the semiconductor structure formed by this specific embodiment can be seen in FIGS. 1-4. The semiconductor structure in this specific embodiment may be, but is not limited to, a DRAM. As shown in FIGS. 1-5, the method for forming a semiconductor structure includes the following operations.

At S51, a substrate is provided.

At S52, multiple word lines 15 are formed on a top surface of the substrate. Each of the word lines 15 extends in a direction parallel to the top surface of the substrate. The multiple word lines 15 are arranged at intervals in a direction D3 perpendicular to the top surface of the substrate. Any two adjacent word lines 15 are at least partially staggered with respect to one another in the direction D3 perpendicular to the top surface of the substrate.

Some embodiments of this specific embodiment provide a semiconductor structure and a method for forming a semiconductor structure. Each word line extends in a direction parallel to a top surface of a substrate, and any two adjacent word lines are at least partially staggered with respect to one another in a direction perpendicular to the top surface of the substrate. Thus, the facing area between the two adjacent word lines can be reduced, thereby reducing the effect of capacitive coupling between two adjacent word lines, and improving the electrical performance of the semiconductor structure. In addition, the disclosure reduces the effect of capacitive coupling by reducing the facing area between the two adjacent word lines, and it is unnecessary to increase the distance between the two adjacent word lines in the direction perpendicular to the top surface of the substrate, thereby contributing to controlling the size of the semiconductor structure.

The above description is a preferred embodiment of the disclosure. It is to be noted that a number of modifications and refinements may be made by those ordinarily skilled in the art without departing from the principles of the disclosure, and such modifications and refinements are also considered to be within the scope of protection of the disclosure.

What is claimed is:

1. A semiconductor structure, comprising:
a substrate; and
multiple word lines located on a top surface of the substrate, each of the word lines extending in a direction parallel to the top surface of the substrate, the multiple word lines being arranged at intervals in a direction perpendicular to the top surface of the substrate, and any two adjacent word lines being at least partially staggered with respect to one another in the direction perpendicular to the top surface of the substrate; and
multiple semiconductor layers located on the top surface of the substrate, wherein each of the semiconductor layers comprises multiple active pillars arranged at intervals in a first direction, the multiple semiconductor layers being arranged at intervals in the direction perpendicular to the top surface of the substrate, each of the active pillars comprising a channel area, and a source area and a drain area arranged in a second direction, the source area being distributed on one side of the channel area, the drain area being distributed on opposite side of the channel area, each of the word lines continuously covers the multiple channel areas arranged at intervals in the first direction in one of the semiconductor layers, the first direction and the second direction being directions parallel to the top surface of the substrate, and the first direction being orthogonal to the second direction; and
multiple bit lines located on the top surface of the substrate, each of the bit lines extending in the direction perpendicular to the top surface of the substrate, the multiple bit lines being arranged at intervals in the first direction, and one of the bit lines being electrically connected to the multiple source areas arranged at intervals in the direction perpendicular to the top surface of the substrate.

2. The semiconductor structure according to claim 1, wherein any two adjacent word lines are completely staggered with respect to one another in the direction perpendicular to the top surface of the substrate.

3. The semiconductor structure according to claim 2, wherein each of the word lines extends in a first direction, and projections of any two adjacent word lines in a plane formed by the first direction and the direction perpendicular to the top surface of the substrate overlap one another.

4. The semiconductor structure according to claim 1, wherein the multiple word lines are sequentially sorted in the direction perpendicular to the top surface of the substrate, projections of any two adjacent odd-numbered word lines on the top surface of the substrate being coincident with one another, and projections of any two adjacent even-numbered word lines on the top surface of the substrate being coincident with one another.

5. The semiconductor structure according to claim 4, wherein each of the word lines extends in a first direction, each of the word lines comprising a first end portion and a second end portion opposite to the first end portion in the first direction, the first direction being a direction parallel to the top surface of the substrate, and the semiconductor structure further comprises:

multiple word line leads located on the top surface of the substrate, each of the word line leads extending in the direction perpendicular to the top surface of the substrate, and the multiple word line leads being electrically connected to the first end portions of the respective word lines.

6. The semiconductor structure according to claim 5, wherein in any two odd-numbered word lines adjacent in the direction perpendicular to the top surface of the substrate, one word line closer to the substrate has the first end portion extending beyond the first end portion of the other word line in the first direction; and
in any two even-numbered word lines adjacent in the direction perpendicular to the top surface of the substrate, one word line closer to the substrate has the first end portion extending beyond the first end portion of the other word line in the first direction.

7. The semiconductor structure according to claim 6, wherein in any two word lines adjacent in the direction perpendicular to the top surface of the substrate, one word line closer to the substrate has the first end portion extending beyond the first end portion of the other word line in the first direction.

8. The semiconductor structure according to claim 4, wherein each of the word lines extends in a first direction, each of the word lines comprising a first end portion and a second end portion opposite to the first end portion in the first direction, the first direction being a direction parallel to the top surface of the substrate, and the semiconductor structure further comprises:
multiple word line leads located on the top surface of the substrate, each of the word line leads extending in the direction perpendicular to the top surface of the substrate, the word line leads electrically connected to respective odd-numbered word lines being all located at the first end portions of the respective odd-numbered word lines, and the word line leads electrically connected to respective even-numbered word lines being all located at the second end portions of the respective even-numbered word lines.

9. The semiconductor structure according to claim 8, wherein each of the word lines comprises a first end surface and a second end surface opposite to the first end surface in the first direction;
the first end surfaces of all the odd-numbered word lines are flush with each other, and the second end surfaces of all the odd-numbered word lines are flush with each other; and
the first end surfaces of all the even-numbered word lines are flush with each other, and the second end surfaces of all the even-numbered word lines are flush with each other.

10. The semiconductor structure according to claim 8, wherein in any two odd-numbered word lines adjacent in the direction perpendicular to the top surface of the substrate, one word line closer to the substrate has the first end portion extending beyond the first end portion of the other word line in the first direction; and
in any two even-numbered word lines adjacent in the direction perpendicular to the top surface of the substrate, one word line closer to the substrate has the second end portion extending beyond the second end portion of the other word line in the first direction.

11. The semiconductor structure according to claim 5, wherein a bottom surface of the word line lead electrically connected to a respective one of the word lines is completely located on this word line.

12. The semiconductor structure according to claim 5, wherein a bottom surface of the word line lead connected to a respective one of the word lines is partially located on this word line.

13. The semiconductor structure according to claim 1, wherein the multiple word lines are sequentially sorted in the direction perpendicular to the top surface of the substrate, projections of any two adjacent $3n^{th}$ word lines on the top surface of the substrate are coincident with one another, projections of any two adjacent $3n+1^{th}$ word lines on the top surface of the substrate are coincident with one another, and projections of any two adjacent $3n+2^{th}$ word lines on the top surface of the substrate are coincident with one another, n being an integer.

14. A method for forming the semiconductor structure according to claim 1, comprising:

providing a substrate; and forming multiple word lines on a top surface of the substrate, with each of the word lines extending in a direction parallel to the top surface of the substrate, the multiple word lines being arranged at intervals in a direction perpendicular to the top surface of the substrate, and any two adjacent word lines being at least partially staggered with respect to one another in the direction perpendicular to the top surface of the substrate; and forming multiple semiconductor layers located on the top surface of the substrate, wherein each of the semiconductor layers comprises multiple active pillars arranged at intervals in a first direction, the multiple semiconductor layers being arranged at intervals in the direction perpendicular to the top surface of the substrate, each of the active pillars comprising a channel area, and a source area and a drain area arranged in a second direction, the source area being distributed on one side of the channel area, the drain area being distributed on opposite side of the channel area, each of the word lines continuously covers the multiple channel areas arranged at intervals in the first direction in one of the semiconductor layers, the first direction and the second direction being directions parallel to the top surface of the substrate, and the first direction being orthogonal to the second direction; and forming multiple bit lines located on the top surface of the substrate, each of the bit lines extending in the direction perpendicular to the top surface of the substrate, the multiple bit lines being arranged at intervals in the first direction, and one of the bit lines being electrically connected to the multiple source areas arranged at intervals in the direction perpendicular to the top surface of the substrate.

* * * * *